United States Patent [19]

Reil

[11] 4,387,547
[45] Jun. 14, 1983

[54] DEVICE FOR MANUFACTURING PACKAGES FILLED WITH LIQUID

[75] Inventor: Wilhelm Reil, Bensheim, Fed. Rep. of Germany

[73] Assignee: Tetra Pak Developpement S.A., Pully, Switzerland

[21] Appl. No.: 197,077

[22] Filed: Oct. 15, 1980

[30] Foreign Application Priority Data

Nov. 15, 1979 [DE] Fed. Rep. of Germany ....... 2946059

[51] Int. Cl.³ .......................... B65B 9/08; B65B 51/30
[52] U.S. Cl. ........................................ 53/131; 53/551
[58] Field of Search ................. 53/551, 451, 552, 131, 53/554; 493/241, 242, 240, 403, 402, 355, 934, 936, 228, 253

[56] References Cited

U.S. PATENT DOCUMENTS

| 2,113,636 | 4/1938 | Vogt | 53/451 X |
| 3,293,824 | 12/1966 | Dorr | 53/131 |
| 3,307,323 | 3/1967 | Fener | 53/551 |
| 3,325,961 | 6/1967 | Lindh et al. | 53/551 X |
| 3,335,540 | 8/1967 | Reil et al. | 53/551 X |
| 3,464,181 | 9/1969 | Hechenleitner | 53/551 X |
| 3,738,080 | 6/1973 | Reil | 53/551 |
| 3,849,965 | 11/1974 | Dominici | 53/451 |
| 3,857,223 | 12/1974 | Dominici | 53/552 X |
| 4,199,919 | 4/1980 | Moscatelli | 53/552 |
| 4,215,520 | 8/1980 | Heinzer et al. | 53/552 X |
| 4,266,389 | 5/1981 | Linde et al. | 53/551 X |

FOREIGN PATENT DOCUMENTS

| 278660 | 2/1970 | Austria . |
| 293280 | 9/1971 | Austria . |
| 1146431 | 7/1957 | Fed. Rep. of Germany . |
| 1218332 | 3/1963 | Fed. Rep. of Germany . |
| 2014974 | 3/1970 | Fed. Rep. of Germany . |
| 2131906 | 6/1971 | Fed. Rep. of Germany . |
| 2410101 | 3/1974 | Fed. Rep. of Germany . |
| 2851411 | 11/1978 | Fed. Rep. of Germany . |
| 2227178 | 4/1974 | France . |

*Primary Examiner*—Horace M. Culver
*Attorney, Agent, or Firm*—Biebel, French & Nauman

[57] ABSTRACT

A device for manufacturing packages filled with liquid, including a device for forming a web of paper having a thermo-plastic coating, into a tube which is vertically displaceable step by step in the device from above downwardly. The device also includes longitudinal and transverse embossing devices; sealing jaws working together in pairs for transversely sealing the tube when it is intermittently positioned stationary at intervals corresponding to the length of a package; a pair of cutting blades disposed beneath the sealing jaws a distance equal to the length of the package for separating the package from the tube in the area of a transverse welded seam; and rotatable supporting plates for the package, disposed between the transverse sealing jaws and the pair of cutting blades. In addition, it is preferred that the transverse embossing device be disposed above, and that the forming station be disposed below, a feeding device, so that their movements are coupled together; and that the forming station have movable forming jaws which embrace a given package on all sides. The forming jaws preferably include movable longitudinal measuring jaws as well as transverse measuring jaws which substantially completely enclose the sides of the packages being filled.

8 Claims, 6 Drawing Figures

DEVICE FOR MANUFACTURING PACKAGES FILLED WITH LIQUID

BACKGROUND OF THE INVENTION

The invention relates to a device for the manufacture of packages filled with liquid, and includes means for transforming a web of paper having a thermoplastic coating, into a tube which can be advanced in the device step-by-step vertically from above downwardly; with longitudinal and transverse stamping devices; with sealing dies movable in a horizontal direction and working together in pairs for transverse sealing of the tube when it is stationary, and along its length at distances corresponding to the length of a package; with a pair of cutting blades disposed the length of a package below the sealing dies, for separating a package from the tube in the area of a transverse welding seam; and with rotatable supporting plates for the package, disposed between the transverse sealing dies and the pair of cutting blades.

Such a device is know, for example, from German Published Patent Application No. 2,131,906. In that device, in order to protect the fresh transverse welded seam with the aid of a shut-off member, provision is made for the column of liquid to be held away from the transverse welded seam during the downward feeding step of the web when the web is squeezed together. This had the advantage that the transverse welded seam could be immediately drawn out of simple, uncooled, sealing dies and could harden during the advance of the length of a downward step because only after that was the material to be packaged allowed to flow due to opening of the shut-off member.

While, with the known device, special attention was directed to the liquid-tightness of the packages to be manufactured, allowance was consciously made for the delayed in-flow of the liquid to be packaged.

The purpose of the instant invention is to produce a greater output, to assure exactly-measured-out quantities of the material to be placed in the packages, and to provide a fold in the packages at the desired places.

SUMMARY OF THE INVENTION

In accordance with the invention, this purpose is accomplished by disposing the transverse stamping device above, and the forming station below, a feeding device, whereby their movements are coupled together, and by providing the forming station with movable forming jaws which embrace a given package on all sides. Since, in industry, more vertical space is available than floor space, and the liquid material to be placed in the packages endeavors to flow downwardly in the tubular paper web, the device according to the invention is built in a vertically arranged manner. The tube of the web of paper is provided from above with longitudinal stamped lines and enters first into the transverse embossing device in which it receives the embossed lines running transverse to the direction of movement of the traveling web of paper as well as the embossed lines running obliquely thereto. Then the tubular paper web passes through the feeding device and enters the forming station. The novel transverse embossing device, explained below in more detail, assures, in a reliable manner and with high output, a satisfactory partial formation of the liquid-containing package to be formed. An important aspect of the forming station of the present invention is the utilization of movable forming jaws embracing a given package on all sides.

In order to increase output, the shut-off member of the known device has been dispensed with so that the liquid is standing earlier—of course, with only a thinner column of liquid—above the fresh transverse welding seam, whose sealed state is assured, according to the invention, by the fact that the forming jaws approach each other inwardly at their lower edges and are held in such a position that the earlier-partially-preformed package remains in an exactly defined, extended condition. This advantageously prevents an indefinite bulging of the portions of the tubular paper web which later produce the side walls.

In a preferred embodiment, the invention is characterized by the fact that there are provided two longitudinal forming jaws which are pivotable about axes disposed parallel to the axis of rotation of the supporting plates, as well as two small forming jaws are pivotable transversely to the first jaws. Thus, the surfaces of the tubular paper web are supported on four sides; the size of the surfaces can be so adjusted by suitable arrangement of the forming jaws that the ultimate dimensions of the parallelepipedic, for example, package can result. The swiveling of the jaws about axes of rotation is an easily controlled step, to provide controllable and reliable partial structures of the ultimate package shape according to the invention.

In an advantageous further embodiment of the invention, the portions of the forming station are controlled with relation to one another in the operating cycle of the device in such a manner that, after the transverse sealing seam has been cut through, the bottom closure of the package formed thereover is held by the supporting plates which swivel high into the horizontal position when the bottom closure is formed while the measuring jaws separate from each other in synchronized movement. After that, the sealing jaws of the transverse sealing device close and weld the sides of the tubular paper web together and then the jaws separate from one another while the sealed package is advanced downwardly. The forming jaws then swivel toward each other and liquid flows into the elongated partially-formed package against the side walls of the package which are supported by the forming jaws. Subsequently, the transverse sealing seam is again cut through.

From this sequence of operations of the device it would be appreciated that output can be increased over known devices. In the present invention, in contrast to the known device, the time during the downward advance of the web by the length of a package is utilized for the beginning of the in-flow of the liquid to be packaged. Thus, when the transverse sealing seam is cut through, there is already a subsequent partially-prefilled package. In addition, the forming jaws assure that this package is held in a definite—namely, extended—condition.

After the sealing jaws separate from each other, the fresh transverse sealing seam does indeed bear the load of a column of liquid standing above it, but, because of the measures in accordance with the invention, the load is only very slight, for only a very flat or thin column of liquid—that is, one provided with a small cross-section—is standing over the new transverse sealing seam. As the paper tube is pulled downwardly by the advancing device while the liquid slowly continues to fill the tube and expand it, the forming jaws, coming together obliquely below, prevent a transverse pressure which would otherwise tear the transverse sealing seam apart. Thus, the liquid can flow more and more into the package being freshly formed without tearing the seam.

A further advantage of the forming jaws is the above-mentioned supporting of the surfaces of the tubular paper so that the liquid, which is slowly filling the package and pressing it apart in the upper area, can adapt to the desired extended condition of the partially-preformed package. In this way, any undesired sidewise undefined bulging of the web of paper is eliminated. The advantageous result is that the pair of cutting blades always meet the transverse sealing seam at a desired level, preferably in the center, and cut it. The sealing seam, located on the bottom of the package, separates the lower package, form-finished at the bottom closure, for the upper package which is first preformed in the upper area. Therefore, it must be separated through in such a manner that, after the packages are detached, the lower package as well as the upper one has to be absolutely liquid-tight. Thus, it is important to maintain the correct height at which the transverse sealing seam is advanced into the area of engagement of the pair of cutting blades. If the forming jaws were not there, an irregular bulging would cause separation of the transverse sealing seam at various levels, which would lead to damaged goods. The invention eliminates this danger in an advantageous manner.

A more rapid sequence of operations than with prior art devices is made possible by the present invention with the above-described operating cycle, because the liquid can flow into the packages during advance of the web, and consequently less time is required for the final filling-in of the package, while the fresh transverse sealing seam does not bear a load and, instead, is held by the supporting plates. This creates an efficient, serviceable machine which is capable of manufacturing liquid-tight packages.

Although the above described forming station of the present invention has the advantages explained, it is further favorable that, in accordance with the invention, the lines of embossing along which the package is finish-formed in the forming station and later in the final forming station, always lie exactly in the correct position with relation to the lines of intersection and to the pressure brought to bear. In the case of the longitudinal embossing lines, this offers no difficulties. On the other hand, the transverse embossing lines can be disadvantageously displaced in the case of inexact adjustment or feed.

In particular, it has been established that, in embossing grooves in a single or doubled web of paper with jaws converging together in a horizontal direction to form a plurality of grooves simultaneously, undesired paper tensions occur within the tool from one groove to another. Therefore, roller-shaped embossing tools have already been put to use. By their use, paper on all sides of the embossing sites which are formed, for example, by grooves and teeth of oppositely-lying rollers, can be so adjusted that not-too-great tensions exist in the paper in the stamping tool.

However, it has occurred in the known devices that paper coming from without, for example, from a supply station, has a velocity different from that on the outgoing side, and has varying displacements of the paper. In other words, variations in the velocity of the web have been ascertained so that a specific embossing point is displaced from its intended location. Therefore, synchronization between the embossing tools and the advancing mechanism is of special importance. To this end, complicated electronic controls have already been used to provide correspondence between two separate drives; namely, the drive for the stamping rollers and the drive for the feed.

It would be preferable, however, if the web of paper could be controlled with simpler means and still with synchronous movement between the feed and the embossing rollers in such a manner that, to use the pressure at the correct place, the feed need be varied only by small amounts, while the transverse embossing of the paper web takes place automatically at the correct places at the same time.

In accordance with the invention, this is advantageously achieved by the fact that the transverse embossing device is stationarily secured to the framework of the machine and has two shells which are rotatable synchronously with relation to each other, and which receive the package between themselves. The shells are circular in cross-section and have corresponding notches and teeth on the circumference. One of the shells is driven by a belt or a chain and is interconnected to the advancing device. It is simple to drive the other embossing shell, the one not driven by the belt, along with the first one, by disposing both shells on shafts provided with gear wheels, for example. In the case of a packaging machine operating at the high cyclic velocity according to the invention, this simple and sturdy coupling between the feed and the embossing device is surprising, for it occurs despite the direct mechanical attachment of the belt or the chain to a rigid metal rod, for example, which is mounted on the feed, yet under all conditions it is a flawless coupling with the effect of absolutely operation-safe synchronization between the embossing rollers and the feed. Therefore, the feed can be imagined as moving osciallatingly up and down. Control of the print or its use at the correct site on the web of paper is accomplished through small variations in the lift of the feed.

Therefore, it is furthermore suitable in accordance with the invention if one of the shells is mounted eccentrically and the eccentric is controlled pneumatically. On the return stroke, it is suitable if the rotating shafts of the two embossing rollers are separated from each other so that they can move back again in a direction opposite to the embossing device while the web of paper remains standing between them. Here also, in accordance with the invention, a particularly simple, sturdy, and operation-safe construction is selected, in which, on the embossing driving roller, an eccentric is connected by means of a lever to a pneumatic drive, in which, by means of a compressed air control from without, enlargement of the gap between the rollers takes place at the instant of the lower dead center point and lasts till the end of the return stroke to the upper dead center point. Thereafter, the gap diminishes to working magnitude, so that the web of paper can be provided with embossed lines in the desired manner when the forward stroke takes place.

In accordance with the invention, it is also advantageous if the shells are designed as half-shells. In this way, the embossing rollers—on the reverse stroke, for example—go completely out of engagement with the web of paper.

A device for the rotating treatment of advanced webs of paper by means of stamping or printing is already known, in which the operating rollers are stopped, one of them having a flat portion, so that, by arranging the flat portion next to the web of paper, the latter is out of engagement with at least one of the operating rollers. However, in this known device, the operating roller is provided to be freely oscillating about its axis, and, after the arrest is released, is brought uncontrolledly into rotation by means of a weight. Because of this, this device cannot operate synchronously. In addition, the known device has the drawback that engagement of the stamping rollers is actuated by the web of paper itself. The invention advantageously eliminates these uncertainties, and reliable synchronization with simple mechanical means which are thereby particularly sturdy, is attained.

Further advantages, features, and possibilities of application of the instant invention will be apparent from the following description of preferred embodiments, in connection with the drawings.

DETAILED DESCRIPTION OF THE PREFERRED EMBODIMENTS

Figure 1:
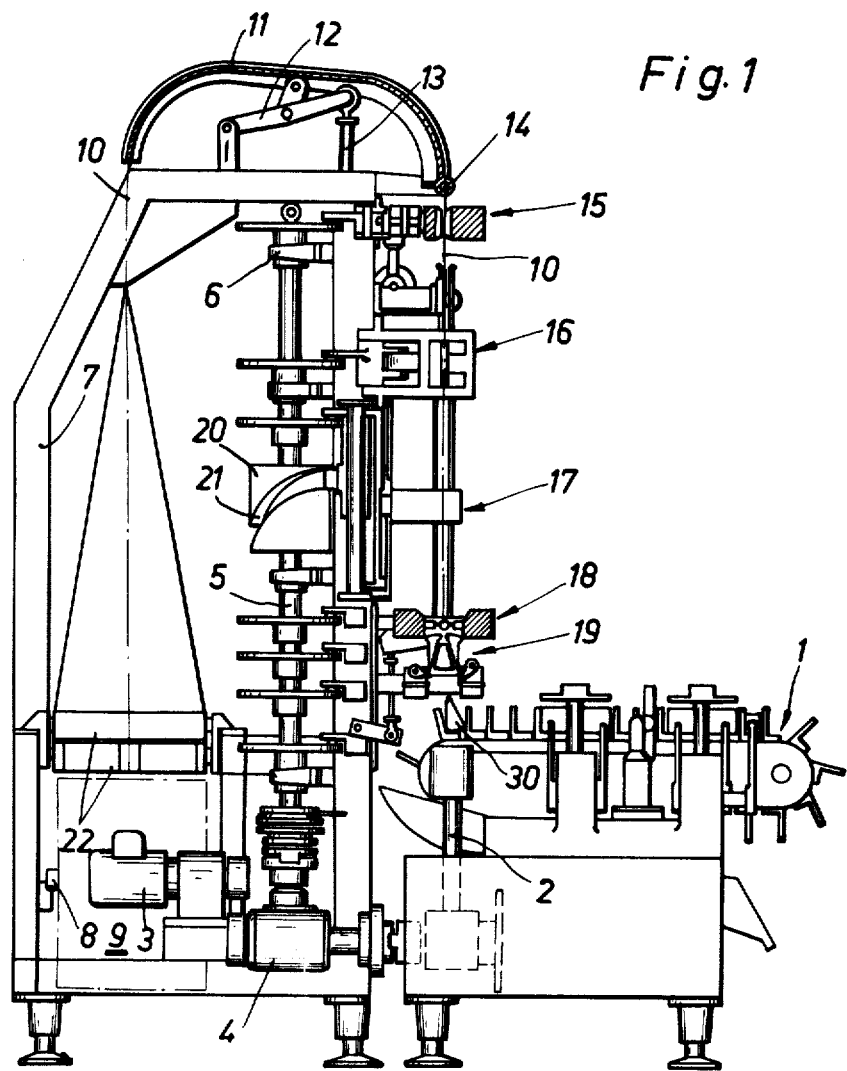
FIG. 1 is an elevational view in partial cross section which shows the total organization of a packaging machine.

The packaging machine represented partially schematized in FIG. 1 consists of the vertical principal portion in the left-hand half and the driving chain 1 and an associated drive 2 with the final forming station shown below at the right.

The drive of the vertical portion is accomplished by the motor 3 by means of the drive 4 and a vertical drive shaft 5, which reaches into the upper area of the machine and is supported at 6.

In the frame 7, behind the motor 3, is mounted the shaft 8 of the roll of material 9 for the web of paper 10, which is shown in dot-and-dash lines. The web 10 follows an inverted U-shaped path as it passes over the guide 11 onto the other side until just above the feed chain 1. By means of a transmission linkage 12, secured to the framework 7 the guide 11 is swiveled about the pivot point 14 with the aid of the connecting rod 13. Below the pivot point 14 is shown the sequence of transverse embossing device 15, longitudinal welding station 16; paper-feed device 17; transverse welding device 18; and automatic forming station 19 with movable forming jaws.

The vertical drive shaft 5 is provided with various cam disks, not designated in more detail, and with the cup-shaped portion 20 with the roller cam 21. The guide 11 and the operating stations 15 to 19 are driven by these elements in a manner described below.

While the jaws, or later-described rollers, of the transverse embossing device 15 are closed, the connecting rod 13 provides for swiveling the guide 11 upwardly so that the web of paper 10, going upward from the roll of material 9, is folded over by the pair of rollers 22 to make the longitudinal groove, and is folded along the center line, shown in dot-and-dash. The web of paper 10 lies over the guide 11 and is glidingly drawn vertically downward with relation to the guide 11 at the instant when the working tools of the embossing device 15 separate from each other, while the feed 17 moves downwardly, and at the same time the connecting rod 13 effects a corresponding downward swivel of the guide 11 about the pivot point 14 in the counter-clockwise direction, controlled by the roller cam 21. In this way, it is possible to maintain the velocity of pulling the web of paper 10 off with the movement of the guide 11, in such a manner that the web of paper can also be advanced uniformly without the inert mass of the large roll of material 9 playing a disadvantageous role.

After being pulled behind the pivot point 14, the web of paper 10 first arrives in the transverse embossing device 15, where the necessary groovings or embossings running obliquely or transversely to the direction of the web are made. The longitudinal seam 35 (FIG. 2) is welded in the device 16, after which the web of paper 10 travels downwardly through the feeding device 17 and arrives in the transverse sealing station 18, beneath which a package is pre-formed and finally detached in the forming station 19.

Figure 2:
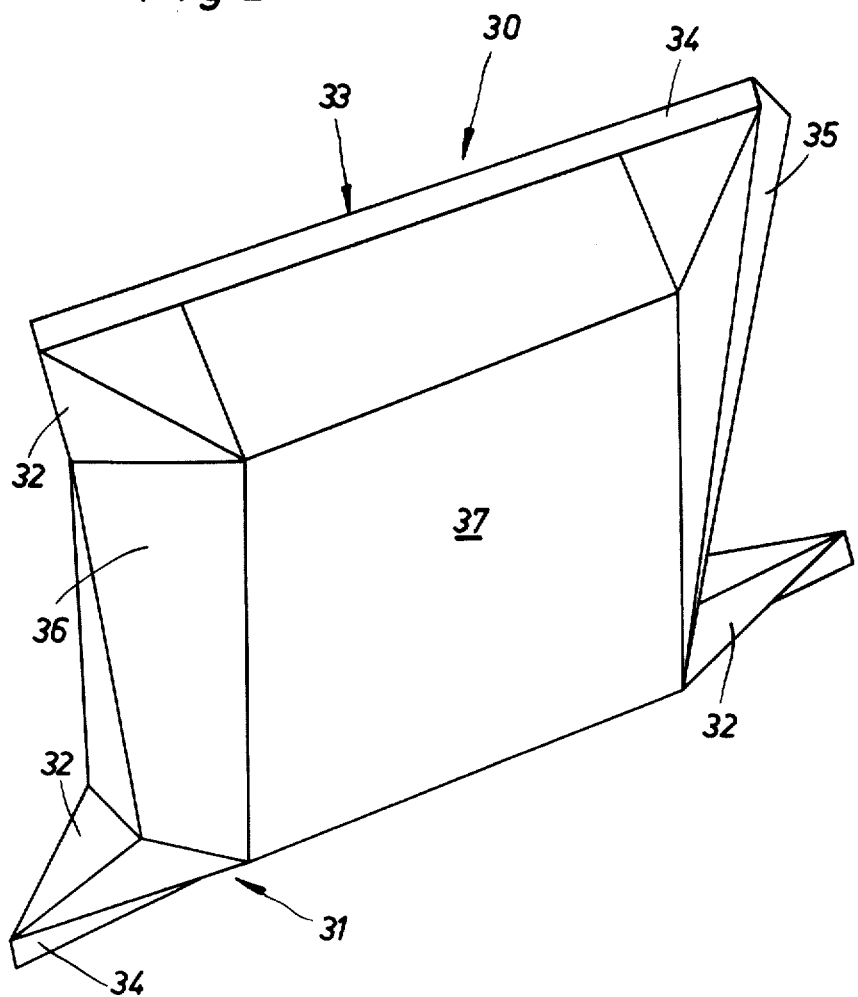
FIG. 2 is a perspective view of a package after it has left the automatic forming station.

The detached package 30, falling downwardly after leaving the forming station 19, is shown in perspective in FIG. 2. Its bottom closure 31 is finish-formed as far as the projecting tabs 32, while the upper closure 33 is still in extended position. The square package customary in the packaging of milk is formed from this later. Also, on the upper closure 33, are situated, fore and aft, the doubled triangular tabs 32; furthermore, above and way down at the bottom, one will recognize the transverse bottom sealing seam 34, and at the right, in back, the longitudinal sealing seam 35 formed in station 16. The improved forming station 19 will first be explained below with reference to this package, which is viewed in FIGS. 1, 3, and 5 from the front narrow side 36 and in FIG. 4 from the wide side wall 37.

Figure 3:
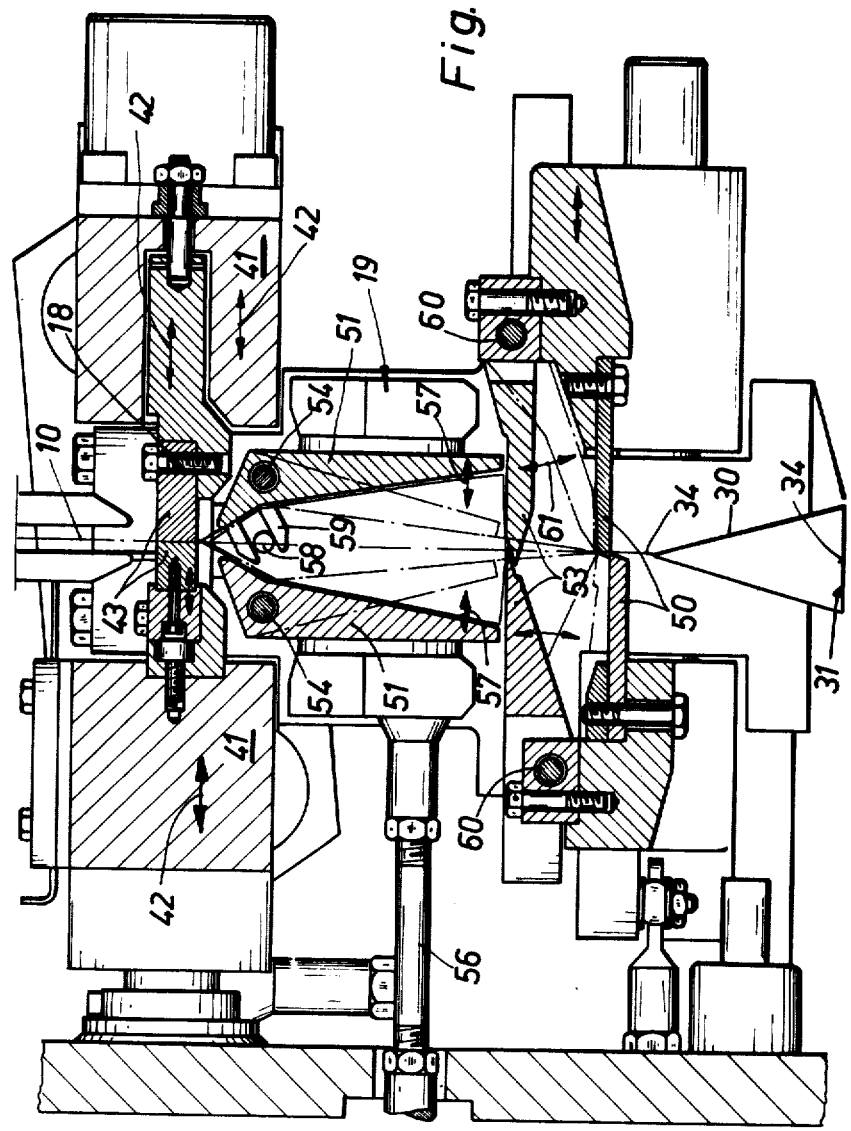
FIG. 3 shows an enlarged detail view in partial cross section of the forming station.
Figure 4:
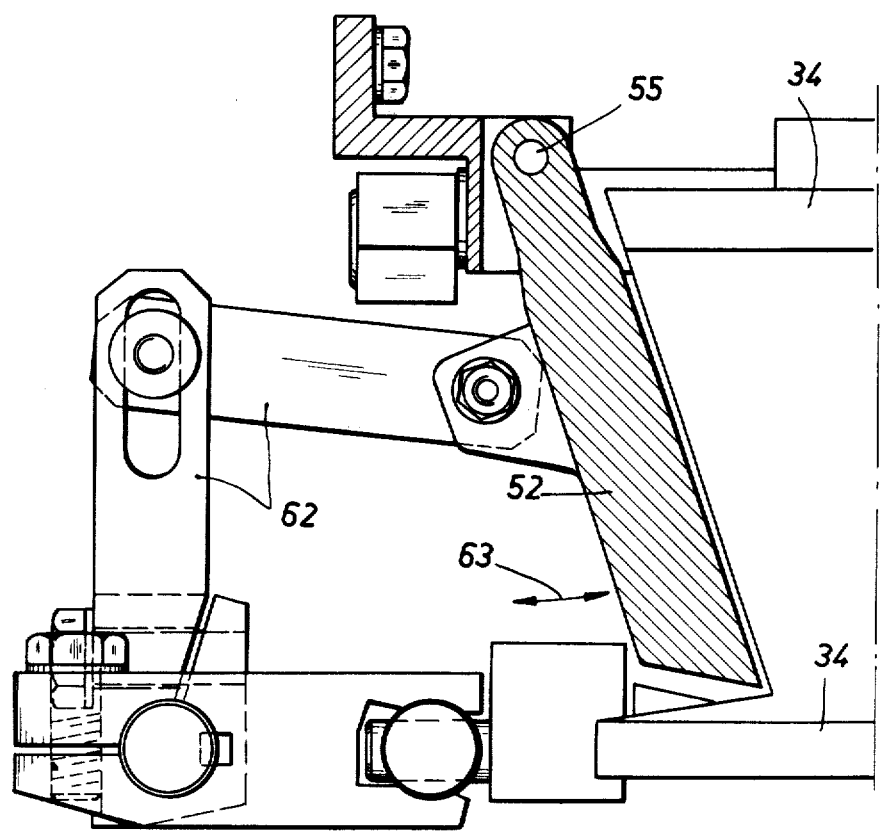
FIG. 4 shows a broken-off view, likewise represented partially in cross section, of a longitudinal forming jaw of the forming station, the section being here rotated by 90 degrees with relation to that in accordance with FIG. 3.
Figure 5:
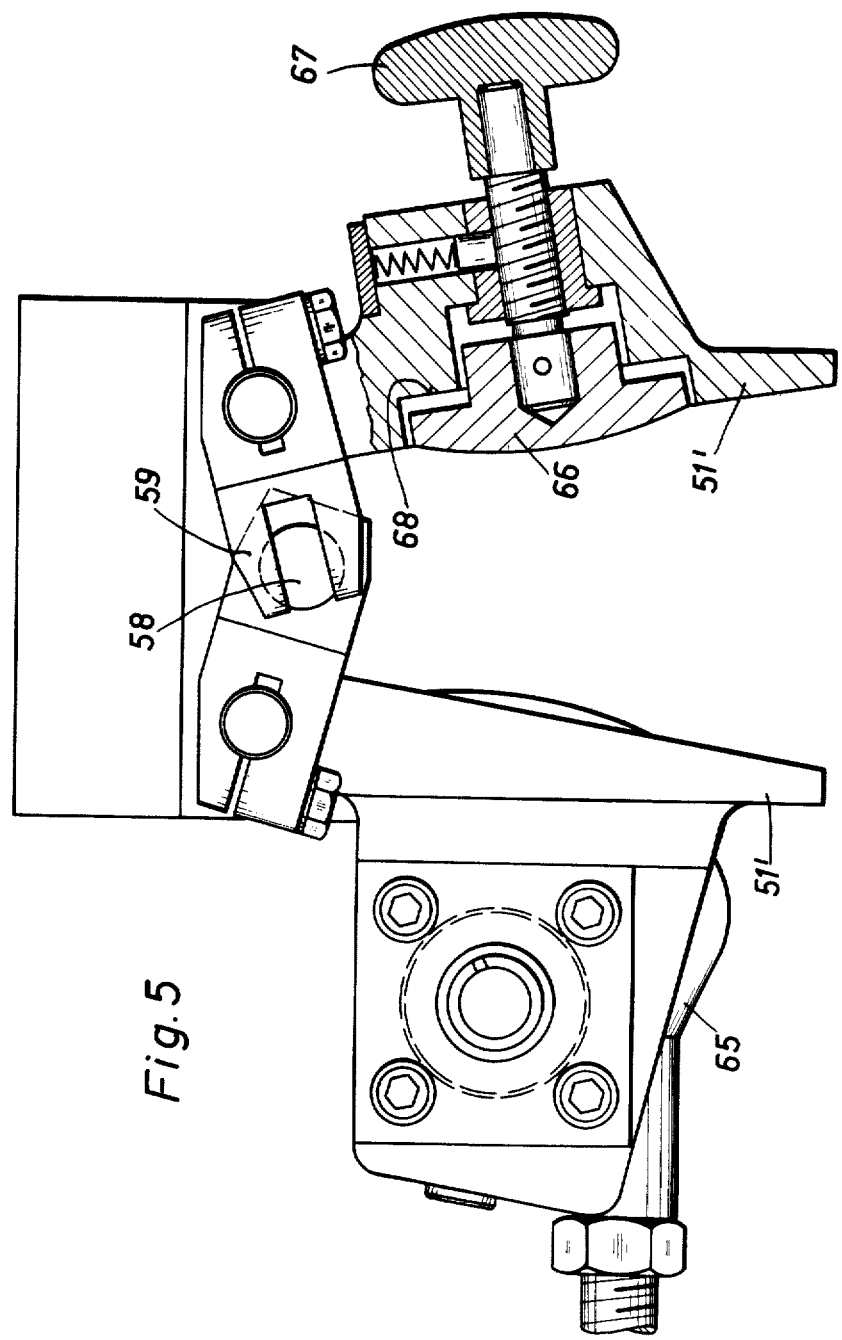
FIG. 5 shows a view similar to those of FIGS. 3 and 4, but of another embodiment, with a printing stamp.

The forming station 19 is to be understood as being shown in broken-off views and partly in section with reference to FIGS. 3 to 5. In the upper portion will be recognized the transverse sealing station 18 and, below it, the forming station 19. A carrier 41 is disposed on both sides of the web of paper 10 and movable to and fro in the direction of the double arrow 42. The sealing jaws 43 are held and connected to the carrier 41 by screw-thread devices, not designated in more detail, in such a manner that they, like the carrier, move in the direction of the double arrow 42. To produce the transverse sealing seam 34, they travel onto the web of paper 10 and press it between themselves in the manner shown in FIG. 3. When the sealing jaws 43 separate, a transverse sealing seam has been created, which has a double width; namely, for the upper transverse sealing seam 34 of the lower package 30 as well as the lower transverse sealing seam 34 of the upper or thereover-disposed package 30. This pair of transverse sealing seams in the web will be separated from each other by the transverse blades 50, shown below, which cover the web to form the aforementioned two transverse sealing seams 34.

Below the transverse sealing or welding station 18 is situated the forming station 19, which, in addition to the device with the pair of cutting blades 50, consists substantially of a pair of longitudinal forming jaws 51 and a pair of transverse forming jaws, 52 (FIG. 4), as well as two package supporting plates 53. In FIG. 3 will be recognized the two longitudinal forming jaws 51, swivelable about the axes 54, which jaws lie against the longitudinal side walls 37 of the package shown in FIG. 2, while on each side, about axes 55, disposed transversely to the axes 54, transverse forming jaws 52 lie against the narrow side walls of the package 36, of which only the left-hand forming transverse jaw 52 is shown in FIG. 4.

The drive of the forming jaws 51, 52 is accomplished mechanically by means of tie rods, levers, etc., of which, in FIG. 3, only the tie rod 56 is designated, which is mounted on the left-hand forming jaw 51 in such a manner that it swivels the latter in the direction of the curved double arrow 57 about the axis 54. By means of the slide ring 58, secured to the axis 54 and to the left-hand forming jaw 51, said slide ring being movably arranged on a fork 59 secured to the right-hand longitudinal forming jaw, the last-named right-hand longitudinal forming jaw 51 is moved in the direction of the curved double arrow 57 at the same time.

Similarly swivelably driven are the supporting plates 53, which rotate about the axes 60, out of the horizontal position, shown in hatched lines in FIG. 3, into the position shown in dot-and-dash lines; that is, corresponding to the curved double arrow 61.

The drive of these swiveling parts is accomplished by means of the various cam or curve disks in accordance with FIG. 1. The development of these rotary movements, in order that they may be synchronous with one another in the desired manner, can be made by a technician after suitable posing of the problem and suitable instruction, so that a complicated representation of this drive in detail can be dispensed with here. This also applies to the representation according to FIG. 4, in which control levers 62 take care of the swiveling motion of the transverse forming jaw 52 in the direction of the curved double arrow 63.

The web of paper or partially-pre-formed package is represented in the forming station 19 in solid or dot-and-dash lines. The functioning will be explained briefly with reference to the latter. From the position shown in FIG. 3, the transverse sealing jaws 43 first separate from each other in the direction of the arrow 42 to the right or left, while the feed advances the web of paper from above downwardly in such a manner that the transverse welding seams 34 disposed directly one below the other move downward from the jaws 43 shown in FIG. 3 to the level of the pair of cutting blades 50, where they are separated, so that, after being pre-formed by the forming jaws 51, 53 moving away from each other, the pre-formed package 30, shown below, is detached and can be allowed to drop onto the advancing chain 1 shown in FIG. 1. In the package 30 at the forming station 19, one will recognize the lower as well as the upper transverse welding seam 34 and the lower fully-formed closure 31, while the upper side of the package is only slightly pre-formed at first.

However, the dot-and-dash position of the package between the inwardly inclined position forming jaws 51, 52 has been reached before the pair of cutting blades 50 severs the transverse welding seams in the middle. When the transverse welding seams 34 travel down out of the sealing jaws 43 to the level of the pair of cutting blades 50, the longitudinal and transverse forming jaws 51 and 52 move inwardly out of the full line position shown, in order to support the thin tube of the web of paper 10, filled with liquid, and hold it together. It is understood that at the same time the supporting plates 53 move downwardly with a swiveling motion, so that finally the positions of the package and the forming jaws, shown in dot-and-dash lines, are assumed. The weight of the liquid presses the walls of the package apart while at the same time the lower transverse sealing seam has hardly any load. After being severed by the pair of cutting blades 50, it is clamped and held between the two supporting plates 53 as shown in broken lines in FIG. 5. Now the actual forming begins through the upward travel of the supporting plates 53 according to the double arrow 61, while at the same time the longitudinal forming jaws 51 swivel outwardly to the right in the direction of the double arrow 57. Finally, the position of the package 30, shown in solid lines in FIG. 3, is reached and the cycle begins anew.

In the embodiment represented in FIG. 5, the longitudinal jaws 51' are shown again, the left-hand one of which is controlled in the above-described manner by the spherical articulated head 65 by means of the slide ring 58 and the form 59. The difference of the embodiment shown in FIG. 5 from that shown in FIG. 3 consists in the fact that here a pressure stamp 66, adjustable by means of a measuring screw 67, is disposed in a recess 68, in order to increase or decrease the volume of the package 30, shown in FIG. 3, by small amounts. Also, both longitudinal jaws 51' could be provided with such a pressure stamp 66.

Figure 6:
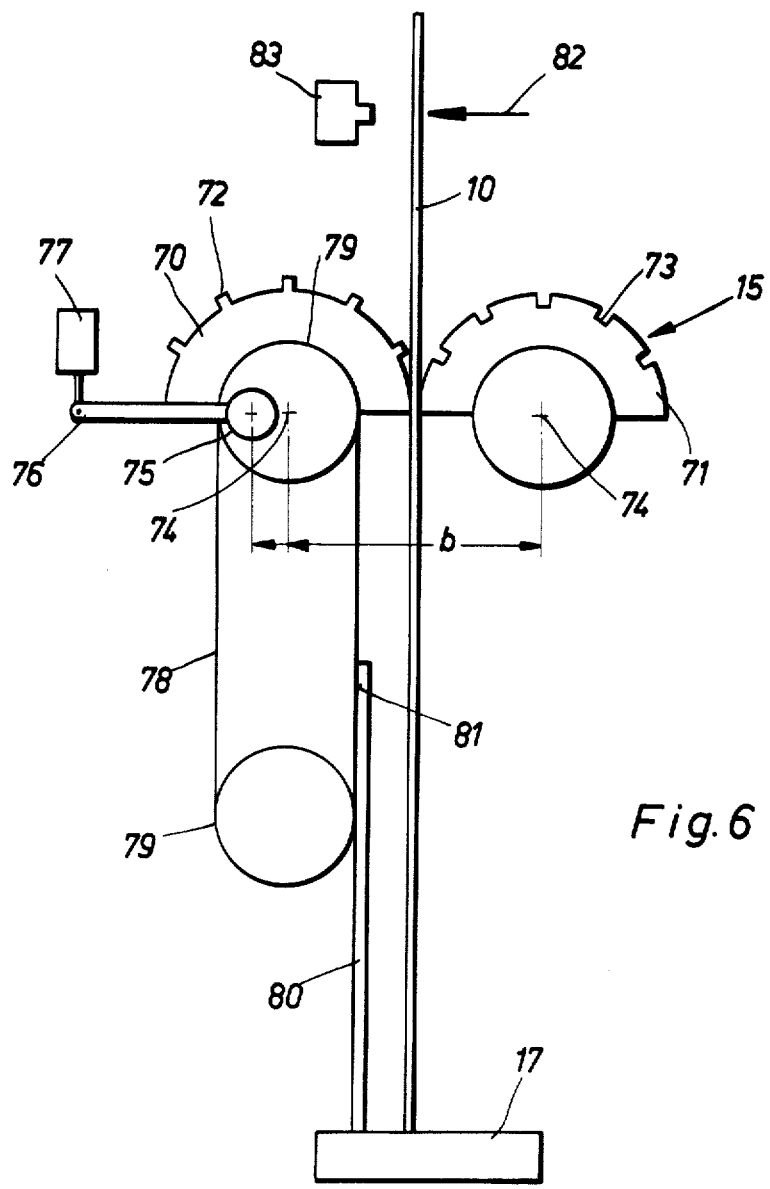
FIG. 6 shows, schematically, the transverse embossing device with two embossing rollers in the form of half-shells.

The transverse embossing device 15 shown schematically in FIG. 6 has two embossing rollers 70 and 71 in the form of half-shells, the roller 70 having teeth 72 and the roller 71 having notches 73 at specific points provided at distances from one another, in order to provide the customary transverse and oblique folds or grooves. The embossing shells 70, 71 are rotatable about the axes 74 in an oscillating or to-and-fro movement. The right-hand shell 74 is connected by means of a gear wheel, not shown, directly to the left-hand half-shell 70, so that, when the left-hand one is driven, the right-hand one automatically travels along with it in synchronization.

In comparison to the right-hand embossing shell 71, the left-hand shell 70 swivels by means of a schematically-represented eccentric 75 in such a manner that the interval b between the axes 74 is adjustable. The eccentric 75 is shifted mechanically by means of a lever 76, which is driven by means of a compressed-air cylinder 77. The latter is stressed with compressed air, the control of which is accomplished by means of the feed 17, indicated schematically below.

The left-hand embossing shell 70 is driven by means of a belt 78, which is placed over chain gear wheels or belt disks (or pulleys) 79, which are freely rotatable. A rod 80 is firmly mounted on the feed and is solidly connected at 81 to the belt or chain 78 in such a manner that when the feed rises high during the return stroke the belt 78 makes such a movement that the left-hand embossing shell 70 swivels in counter-clockwise direction, and vice versa.

Finally, at the top, a specific position of an image is designated by the arrow 82 which can be scanned by means of a photocell 83.

The drive of the embossing device 15, according to FIG. 6, is accomplished in such a manner that the two half-shells 70 and 71 are rotated out of engagement with each other still farther than in the representation according to FIG. 6, while the distance of the axes b has its greatest value. Now the pneumatic cylinder 77 is controlled and shifts the eccentric 75 to the right in such a manner that the distance b between the axes 74 assumes the smaller value. The feed 17 begins with the downward stroke and thereby, by means of the connecting point 81, pulls the right-hand strand of the belt 78 downwardly. In this way, the two embossing shells 70 and 71 are rotated in such a manner that the single- or double-layer paper 10 passing between them is stamped or embossed at the desired points. After the lower dead-center point has been reached, the pneumatic cylinder 77 increases the distance b between the axes; the feed travels upwardly; the half-shells 70, 71 rotate into starting position again; and the cycle can begin anew.

Instead of embossing longitudinally prior to transversely in the web of material as described above the entire embossing, that means longitudinally and transversely can be effected by the described embossing device 15. With other words, immediately with the embossing transversely also embossing longitudinally is performed. Thereby different advantages can be reached. Namely with respect to the liquid package to be manufactured it can really be important, suitable and advantageous if the transverse embossing is made only on predetermined, desired points. For example it can be desired to interrupt the longitudinal embossing at certain points in order to avoid that lateron the tightness of the liquid package is jeopardized. Furthermore in this manner it is possible to provide not only the transversely embossed lines but also the longitudinally embossed lines in a defined manner, i.e., partially weaker and partially stronger. Namely it can be suitable and advantageous for the package to be manufactured, for the purpose of a sharp bending to place a sharp groove at some points into the web of material and to place only shallow grooves at other points into the web of material for the purpose of a less sharp folding. This is true both for the longitudinal embossing as well as for the transversely embossing.

These advantages resulting from the two embossing shells 70 and 71 synchronously driven to each other, facilitate a powerful manufacture of reliable and correctly folded and tight liquid packages.

What I claim is:

1. In a packaging device for the manufacture of liquid filled paper packages in which a web of paper is converted into a tube and which is displaced in a step-by-step manner vertically downwardly into a forming device, including longitudinal and transverse embossing apparatus for forming initial bend lines on the web corresponding to the folds of the package, and a pair of sealing jaws which work together for transversely sealing the tube at locations corresponding to the beginning and ending edges of a package formed in the tube, and in which a pair of cutting blades are disposed the length of one of the feeding steps beneath the sealing jaws for separating a formed and filled package from the tube in the region of the transverse welded seam, the improvement comprising:

a forming station including at least one pair of package forming and supporting generally downwardly depending jaws extending in a direction generally longitudinally of a package to be formed in said web, and said forming jaws mounted on generally transverse axes of rotation one on each side of said web so that the jaws are movable between a first position in which the inner surfaces of the jaws are inwardly inclined toward each other to support the side walls of the package during initial filling and movable to a second spread-apart position accommodating and defining the full width of the package when the package is completely filled.

2. The packaging device of claim 1 further having a pair of support plates positioned in underlying relation to the forming jaws, said plates being movable by pivotal movement to a first position inclined downwardly and inwardly toward each other with ends thereof engaging said web substantially at a bottom transverse seam above said cutting blades for supporting an initially formed package, to a raised position in which the upper surfaces thereof support the package bottom during complete filling of the package accompanied by movement of said forming jaws to their respective spread-apart positions, said support plates being further movable transversely of each other to permit downward movement of a filled package subsequent to filling and sealing of the top margin thereof.

3. The device of claim 1 further comprising a second pair of transversely movable forming jaws mounted for pivotal movement about axes at right angles to said one pair of jaws and having oppositely disposed package support surfaces for engaging the end walls of a package to be filled to define the shape of the package, and movable by pivotal movement outwardly from each other to permit passage of the package from the forming station.

4. The device of claim 1 further including adjustable pressure stamp means disposed in at least one of said forming jaws.

5. The device of claim 1 in which said transverse embossing apparatus comprises a pair of generally cylindrical shells, one each positioned on each side of the web having embossing surfaces thereon simultaneously engageable with opposite sides of the web upon rotation of said shells, and being mutually peripherally engageable with each other such that rotation of one of said shells drives the other of said shells in a rotational movement, paper feed means mounted for movement in a reciprocal fashion for moving the web in said feeding steps, and means interconnecting said paper feed means with said one cylindrical shell for effecting synchronous movement of said shells with said paper feed means.

6. The device of claim 5 in which each of said shells is partially cylindrical to provide a clearance on a peripheral portion thereof providing for return movement of said shells to a starting position without engaging said web.

7. An improved forming station for a vertical feed type of form-fill and seal package machine in which a folded web of paper defining a tube is brought into a filling and sealing station, comprising means for embossing the web of paper with lines defining the fold lines of the package, means in association with the forming station for forming a transverse seal across the web defining respectively the bottom and top seals of a package to be formed in the web, web cut-off means disposed below the forming station including knife means engageable with the web at a position spaced from said transverse sealing means in accordance with the longitudinal length of a package to be formed in the web for severing a seal formed by said sealing means dividing the bottom of an upper package from the top of a lower package, package forming means disposed between said transverse sealing means and said knife means, said forming means including a first pair of depending jaws, means pivotally mounting said first pair of jaws for movement between an initial fill position in which said jaws are sloping inwardly toward each other to support a package formed on said web and to prevent bulging of the side walls thereof and a second spread apart position defining the expanded position of said package, a pair of bottom support plates movable in cooperation with said jaws between a first position adjacent said knife means for supporting the bottom of a forming package thereon during initial fill to prevent undue internal side pressures from forming at the bottom seal of the package, and a raised position for supporting the package bottom during the completion of the package filling.

8. The forming station of claim 7 further comprising a second pair of transversely movable forming jaws mounted for pivotal movement about axes at right angles to said first pair of jaws and having oppositely disposed package support surfaces for engaging the end walls of a package to be filled to define the shape of the package, and movable by pivotal movement outwardly from each other to permit passage of the package from the forming station.

* * * * *